(12) United States Patent
Van De Sluis et al.

(10) Patent No.: US 12,209,720 B2
(45) Date of Patent: Jan. 28, 2025

(54) CUSTOMIZABLE LIGHT STRIP AND MOUNTING METHOD

(71) Applicant: SIGNIFY HOLDING B.V., Eindhoven (NL)

(72) Inventors: Bartel Marinus Van De Sluis, Eindhoven (NL); Leendert Teunis Rozendaal, Eindhoven (NL); Marcellinus Petrus Carolus Michael Krijn, Eindhoven (NL); Michel Cornelis Josephus Marie Vissenberg, Roermond (NL)

(73) Assignee: SIGNIFY HOLDING, B.V., Eindhoven (NL)

( * ) Notice: Subject to any disclaimer, the term of this patent is extended or adjusted under 35 U.S.C. 154(b) by 0 days.

(21) Appl. No.: 18/571,644

(22) PCT Filed: Jun. 24, 2022

(86) PCT No.: PCT/EP2022/067294
§ 371 (c)(1),
(2) Date: Dec. 18, 2023

(87) PCT Pub. No.: WO2023/274858
PCT Pub. Date: Jan. 5, 2023

(65) Prior Publication Data
US 2024/0288132 A1    Aug. 29, 2024

(30) Foreign Application Priority Data

Jun. 28, 2021 (EP) ................................. 21182008

(51) Int. Cl.
*F21S 4/24*      (2016.01)
*F21V 23/06*     (2006.01)
(Continued)

(52) U.S. Cl.
CPC ............... *F21S 4/24* (2016.01); *F21V 23/06* (2013.01); *F21Y 2103/10* (2016.08);
(Continued)

(58) Field of Classification Search
CPC . F21S 4/22; F21S 4/24; F21Y 2103/10; F21V 23/06; H05K 1/028
See application file for complete search history.

(56) References Cited

U.S. PATENT DOCUMENTS

| 2014/0029261 | A1 | 1/2014 | Otterson et al. |
| 2017/0359875 | A1 | 12/2017 | Engelen et al. |
| 2019/0003659 | A1* | 1/2019 | Miyajima ................. F21S 8/04 |

FOREIGN PATENT DOCUMENTS

| CN | 110234927 A | * | 9/2019 | ............... F21K 9/90 |
| EP | 2365740 A3 | | 8/2013 | |

(Continued)

*Primary Examiner* — Karabi Guharay

(57) ABSTRACT

The present invention relates to a customizable light strip (10) mountable on a mounting surface (36), comprising: an elongated substrate (12); a linear LED array (18) with a plurality of LED nodes (20) mounted on a surface (14*a*) of the elongated substrate; and an interconnection structure (22) electrically interconnecting the plurality of LED nodes, wherein the elongated substrate comprises partial separation lines (24) between at least some of the plurality of LED nodes of the linear LED array, which partial separation lines extend from one longitudinal edge (16*a*) of the elongated substrate and partly across the elongated substrate and do not intersect the interconnection structure, and wherein the customizable light strip after partial separation at one or more of the partial separation lines is bendable in a plane of said mounting surface.

14 Claims, 8 Drawing Sheets

(51) Int. Cl.
*F21Y 103/10* (2016.01)
*F21Y 107/70* (2016.01)
*F21Y 113/00* (2016.01)
*F21Y 115/10* (2016.01)

(52) U.S. Cl.
CPC ....... *F21Y 2107/70* (2016.08); *F21Y 2113/00* (2013.01); *F21Y 2115/10* (2016.08)

(56) References Cited

FOREIGN PATENT DOCUMENTS

| | | | |
|---|---|---|---|
| EP | 2854392 | A1 | 4/2015 |
| EP | 3142468 | A1 | 3/2017 |
| GB | 2484152 | A | 4/2012 |
| JP | 2007024245 | A | 2/2007 |

\* cited by examiner

CUSTOMIZABLE LIGHT STRIP AND MOUNTING METHOD

CROSS-REFERENCE TO PRIOR APPLICATIONS

This application is the U.S. National Phase application under 35 U.S.C. § 371 of International Application No. PCT/EP2022/067294, filed on Jun. 24, 2022, which claims the benefit of European Patent Application No. 21182008.9, filed on Jun. 28, 2021. These applications are hereby incorporated by reference herein.

FIELD OF THE INVENTION

The present invention relates to a customizable light strip. The present invention also relates to a method of mounting such a customizable light strip to a mounting surface.

BACKGROUND OF THE INVENTION

A conventional adhesive light strip cannot easily or properly be bent in the plane of a mounting surface, for example to attach around a TV, mirror, cupboard corner, etc.

US2014029261A1 discloses a printed circuit board provided as an elongate, linear strip. The board in US2014029261A1 can be provided in the desired size and shape by routing, milling, punching, die stamping, or using any suitable technique. The board is made up of a plurality of repeating units. The board has a top surface and a bottom surface. An LED is mounted on each repeating unit and copper traces are printed on the top surface of the board to electrically interconnect the LEDs. The repeating units are designed and connected to permit in-plane deformation or bending of the board. Bridges connect adjacent repeating units such that adjacent edges of adjacent repeating units are separated by a space.

However, a drawback with the printed circuit board in US2014029261A1 is that the numerous spaces separating adjacent edges of adjacent repeating units can unduly weaken the board, in particular for other configurations than the ring-shaped configuration illustrated in US2014029261A1.

EP2365740 discloses a method for manufacturing a plurality of types of illuminating devices having different specifications while suppressing cost. A substrate includes a common portion having flexibility and a plurality of units bendable with respect to the common portion, where the common portion includes a pad that is extended in the horizontal direction in the plane of drawing and that is arranged for every predefined interval In the method, a substrate piece is created by cutting the substrate mounted with the light emitting element in a first direction, the common portion in the substrate piece is formed according to the illuminating device to be manufactured, the relative position of the individual portion with respect to the formed common portion is respectively positioned, and the wiring for supplying power to the pad in the substrate piece is formed.

GB2484152 discloses a method of manufacturing an electrical device. The method comprises the consecutive steps of (i) providing a flat, plastically-deformable circuit board, (ii) mounting one or more electrical components on the flat circuit board and electrically connecting the component(s) in a circuit, and (iii) plastically deforming the circuit board so that it is no longer flat, and such that the component(s) remain(s) mounted on the circuit board and electrically connected in the circuit.

SUMMARY OF THE INVENTION

It is an object of the present invention to overcome this problem, and to provide an improved light strip mountable on a mounting surface.

According to a first aspect of the invention, this and other objects are achieved by a customizable light strip mountable on a mounting surface, comprising: an elongated substrate: a linear LED (light emitting diode) array with a plurality of LED nodes mounted on a surface of the elongated substrate; and an interconnection structure electrically interconnecting the plurality of LED nodes, wherein the elongated substrate comprises partial separation lines between at least some of the plurality of LED nodes of the linear LED array, which partial separation lines extend from one longitudinal edge of the elongated substrate and partly across the elongated substrate and do not intersect the interconnection structure. The customizable light strip after partial separation at one or more of the partial separation lines is bendable in a plane of said mounting surface.

The customizable light strip further comprises a data or detection line connected to at least some of the LED nodes and intersecting the partial separation lines. The LED nodes are configured to detect the position of any partially separated partial separation line through interruption of the data or detection line intersecting that partial separation line.

Each LED node may here be a combination of LEDs, such as RGB (Red-Green Blue) or RGBWW (Red-Green-Blue-Warm White), to enable each node to render a specific color. An LED node could also consist of a single LED.

The ratio of the length and width (L/W) of the elongated substrate may be at least 2, such as at least 5, or at least 10, or at least 100. The linear LED array may comprise at least 10 LED nodes, such as at least 50 LED nodes or at least 100 LED nodes.

The present invention is based on the understanding that by providing partial separation lines not intersecting the interconnection structure, a user can select at what positions along the light strip that the light strip should be bendable (e.g. to follow a corner of the mounting surface) by partially separating the strip at the partial separation lines corresponding to those positions. The remaining partial separation lines may not be separated, whereby the light strip is not unduly weakened. Furthermore, in the particular application where the light strip is to be mounted around a TV on the backside (mounting surface) of the TV, the present light strip can be customized by the user to fit a wide range of TV sizes, for example from 20 inches to 85 inches. In other words, a single type of light strip (=the present customizable light strip) can readily be made to fit objects of different sizes. The 'user' is here typically an end-user or possibly a fitter or an installer, but not a person part of the manufacturing of the light strip. Furthermore, the present light strip can conveniently be provided off-the-roll and be cut-to-measure using cut-to-measure principles known per se.

The partial separation lines may be or include visual markings for cutting the elongated substrate (at those locations). The visual markings could for example be dotted or dashed lines printed on the elongated substrate, optionally together with a printed scissor symbol, to indicate where the user can cut the elongated substrate using e.g. a pair of scissors, without breaking the connection structure electrically interconnecting the plurality of LED nodes. At the ends of the partial separation lines/visual markings opposite said longitudinal edge of the elongated substrate, the elongated substrate could be provided with a warning sign and/or a physical structure adapted to prevent users from cutting too far. The physical structure could for example be an embedded metal wire or a plastic notch.

Alternatively or complementary, the partial separation lines may include perforation lines for allowing a user to tear the elongated substrate (at those locations). An advantage of perforation lines is that no tool, like a pair of scissors, is needed to customize the light strip. Another advantage is that the user will not cut too far (see previous paragraph) since each perforation line stops at the right location.

A partial separation line of said partial separation lines may be provided between each two adjacent LED nodes of the linear LED array. This enables partial separation/cutting/tearing between two adjacent LED nodes anywhere along the elongated substrate, which in turn allows for full customization of the light strip with respect to bending in the plane of the mounting surface.

The plurality of LED nodes may also be grouped into linear LED node groups, wherein a partial separation line of said partial separation lines is provided between each two adjacent LED node groups of the linear LED array. In other words, partial separation lines are only provided between linear LED node groups and not between LED nodes in the group. Each group could for example comprise 2-55 LED nodes. For the particular application where the light strip is to be mounted around a TV on the backside of the TV, the grouping could be based on typical TV sizes (such as 55 inches, 65 inches, and 75 inches) to create segments of appropriate size matching the typical bending points for such typical TV sizes.

The interconnection structure may comprise a linear portion and connection portions, wherein the linear portion is positioned along the linear LED array, and wherein the connection portions electrically connect at least some of the LED nodes of the linear LED array to the linear portion of the interconnection structure. The connection portions may for example be perpendicular to the linear portion. This allows for a comb-like layout of the interconnection structure that the partial separation lines partly can mesh with.

At least one longitudinal folding line on the elongated substrate may be provided between the linear portion of the interconnection structure and the linear LED array, wherein the connection portions of the interconnection structure cross the at least one longitudinal folding line. Folding at the at least one longitudinal folding line may enable tuning the direction (angle) of the linear LED array relative to the mounting surface. The at least one longitudinal folding line could be at least one visual marking on the elongated substrate indicating for the user where to fold the substrate/light strip. The visual marking(s) could be similar to, but should nevertheless be distinct from, the aforementioned visual markings for cutting the elongated substrate. Alternatively the at least one longitudinal folding line could be at least one pre-folded line.

The elongated substrate comprises at least one linear attachment layer. The at least one linear attachment layer may for example be used to mount/attach the bent light strip to the mounting surface and can also assist in forming a stable structure when the substrate/light strip is folded as discussed above. The at least one linear attachment layer may for example be at least one adhesive layer or double-sided tape.

In one embodiment, a second longitudinal folding line on the elongated substrate is provided between the linear LED array and said longitudinal edge of the elongated substrate: the at least one linear attachment layer includes a first linear attachment layer provided on said surface or the opposite surface of the elongated substrate between said second longitudinal folding line and said longitudinal edge of the elongated substrate: a third longitudinal folding line on the elongated substrate is provided between the linear portion of the interconnection structure and the opposite longitudinal edge of the elongated substrate; and the at least one linear attachment layer includes a second linear attachment layer provided on said surface or the opposite surface of the elongated substrate between said third longitudinal folding line and said opposite longitudinal edge of the elongated substrate. Here the elongated substrate may advantageously be folded to form a triangular prism-like shape or to include a gable roof shape, which folded elongated substrate may be attached/mounted to the mounting surface, with the linear LED array on one of the oblique sides (of the triangular prism-like shape or the gable roof shape) relative to the mounting surface. Hence, tuning of the direction/angle of the linear LED array relative to the mounting surface is hereby achieved.

In another embodiment, the elongated substrate comprises a single longitudinal folding line between the linear portion of the interconnection structure and the linear LED array; the at least one linear attachment layer includes a linear attachment layer under the linear LED array on the opposite surface of the elongated substrate; and a linear (substantially) upright section of the elongated substrate extending between said single longitudinal folding line and the opposite longitudinal edge of the elongated substrate is diffuse reflective or translucent for manipulating light emitted by LED nodes of the linear LED array. This embodiment may be simpler to manage for the user because the elongated substrate has only one longitudinal folding line. Depending on the application, the upright section may be diffuse reflective to direct the light and/or create a sharp cut-off, or it may be translucent (e.g. diffuse to give a nice diffuse light effect on the side opposite to the LED nodes). This allows provision of a light strip with diffuse light effect which readily can be bent: it can even make sharp corners. 'Substantially upright' may be defined as $90°±20°$, preferably $90°±10°$.

In yet another embodiment, angular folding lines on the elongated substrate extend from at least some predetermined partial separation lines of said partial separation lines, and wherein the at least one linear attachment layer includes a linear attachment layer on the opposite surface of the elongated substrate. For example, a pair of angular folding lines may extend from each of the predetermined partial separation lines at $±135°$ relative to the partial separation line, which allows the light strip to be bent $90°$. The predetermined partial separation lines may correspond to typical cut/tear positions, for example based on common TV sizes (such as 55 inches, 65 inches, and 75 inches). The linear attachment layer may here cover the entire opposite surface of the elongated substrate. Furthermore, the interconnection structure may here be (at least partly) covered with an insulating layer, in order to avoid shortcuts at folded segments of the strip.

The customizable light strip further comprises at least one data or detection line connected to at least some of the LED nodes and intersecting the partial separation lines. The LED nodes are configured to detect the position of any partially separated partial separation line through interruption of the at least one data or detection line intersecting that partial separation line, which in turn means that individual LED nodes can be controlled accordingly.

The at least one data or detection line may for example be a data bus intersecting the partial separation lines. LED nodes at either side of the cut/torn data bus may be configured to detect and report via the (non-cut/non-torn) interconnection structure where the cut/tear is.

In another example, the at least one data or detection line may be a data line from LED node to LED node (daisy chain). When a user cuts/tears a partial separation line, the LED nodes can detect that they are no longer connected via the data line.

In yet another example, each LED node has a detection line which intersects a partial separation line and electrically connects the LED node to the interconnections structure. When the user cuts/tears the partial separation line, the detection line becomes open, and the LED node can thereby detect that the user has cut/torn the partial separation line.

In a further example, each LED node has at least one detection line extending from the LED node, intersecting a partial separation line, and back to the same LED node, whereby the LED node may detect whether or not the partial separation line is cut/torn or not.

According to a second aspect of the present invention, there is provided method of mounting a customizable light strip to a planar mounting surface, which method comprises: providing a customizable light strip according to the first aspect: partially separating the elongated substrate of the customizable light strip at one or more of the partial separation lines: after separation, bending the customizable light strip at said one or more partial separation lines; and mounting the bent customizable light strip on said planar mounting surface. This aspect may exhibit the same or similar features and technical effects as the previous aspect, and vice versa.

The planar mounting surface may be the backside of an electronic display device, such as a TV or a monitor. Alternatively, the light strip may be mounted/attached to the back of a mirror, bed headboard, cupboard, bottom of couch, around or inside a cabinet, etc.

The method may further comprise: after bending (and mounting), sequentially activating the LED nodes of the linear LED array: capturing imagery of the activation by a remote camera; and analyzing the captured imagery to determine at least one bend of the customizable light strip. By determining the bend(s), individual LED nodes can be controlled accordingly, for example if the customized light strip is used to create background light dynamically matching content displayed on a TV (like Ambilight). The remote camera may for example be the camera of a smart phone or tablet or similar. Analyzing the captured imagery to determine at least one bend of the customizable light strip may for example be performed using an app on the smart phone or tablet.

It is noted that the invention relates to all possible combinations of features recited in the claims.

BRIEF DESCRIPTION OF THE DRAWINGS

These and other aspects of the present invention will now be described in more detail, with reference to the appended drawings showing embodiment(s) of the invention.

FIG. 1a' is a top view of a variants of the light strip of FIG. 1a with LED node groups.

As illustrated in the figures, like reference numerals refer to like elements throughout.

DETAILED DESCRIPTION OF THE EMBODIMENTS

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person.

Figure 1A:
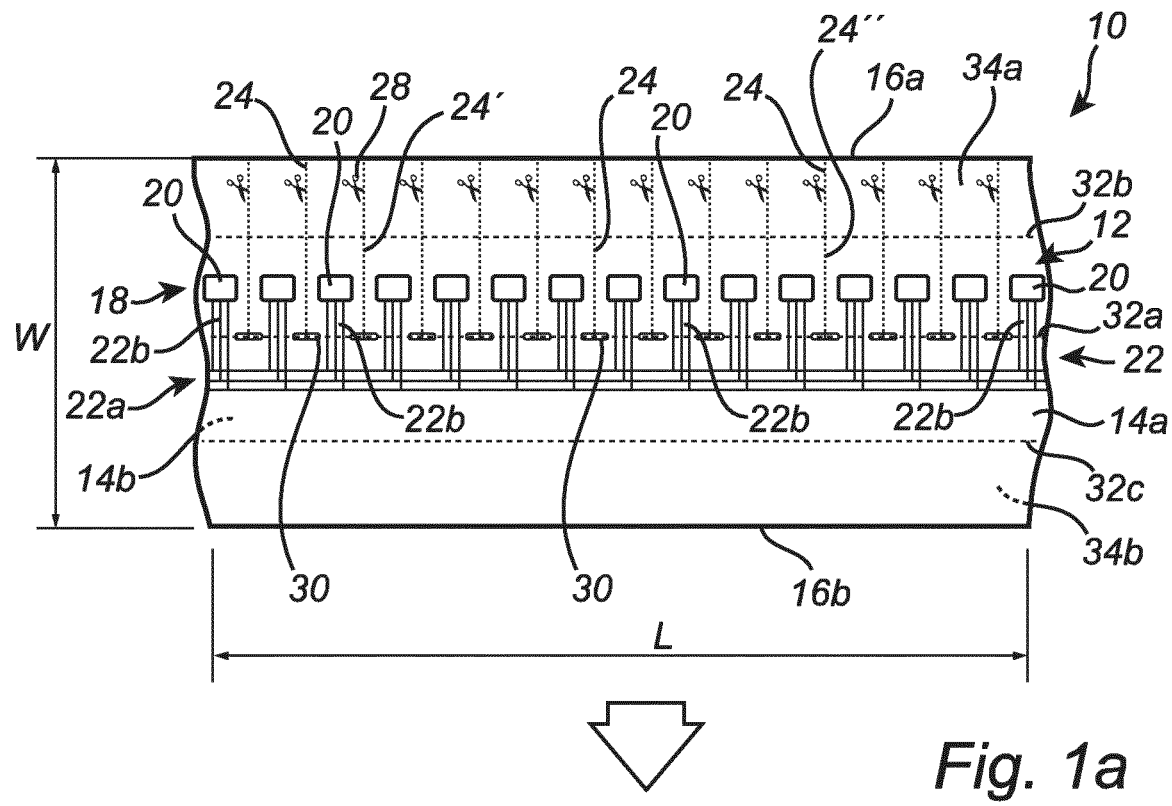
FIG. 1a is a top view of a customizable light strip according to an embodiment of the present invention.

FIG. 1a illustrates a customizable light strip 10 according to an embodiment of the present invention.

The light strip 10 comprises an elongated substrate 12. The elongated substrate 12 may for example have a length L in the range of 1-4 m (for 3-side mounting), which would fit TVs from 20 inches to 85 inches. Alternatively the elongated substrate 12 may have a length L in the range of 1.4-5.9 m for 4-side mounting. The width W of the elongated substrate may for example be in the range of 2-15 cm. Furthermore, the elongated substrate 12 has a first (major) surface 14a and an opposite second (major) surface 14b. The elongated substrate 12 also has a first longitudinal edge 16a and an opposite second longitudinal edge 16b. The elongated substrate 12 is preferably flexible (e.g. made of a polymer).

The light strip 10 further comprises a linear LED array 18 with a plurality of LED nodes 20 mounted on the first surface 14a of the elongated substrate 12. The linear LED array 18 typically extends along (substantially) the complete length L of the elongated substrate 12. The light strip 10 may for example comprise 20-200 LED nodes per meter. The LED nodes 20 are adapted to emit (LED) light. Each LED node 20 may be a combination of (individually controllable) LEDs, such as RGB or RGBWW, to enable each node 20 to render a specific color. An LED node 20 could also consist of a single LED.

The light strip 10 further comprises a (power and/or data) interconnection structure 22 electrically interconnecting the LED nodes 20. The interconnection structure 22 may be adapted to provide power and/or data to the LED nodes 20. The interconnection structure 22 may for example comprise electrically conductive tracks, e.g. of copper, on the first surface 14a of the elongated substrate 12 or embedded in the elongated substrate 12. The tracks of the interconnection structure 22 may for example be arranged in pairs, triplets (illustrated), or quadruplets. As illustrated for example in FIG. 1a, the interconnection structure 22 may comprise a linear portion 22a and connection portions 22b. The connection portions 22b may be perpendicular to the linear portion 22a, as in FIG. 1a. Alternatively, the connection portions 22b could extend obliquely relative to the linear portion 22a, for example at 45 degrees. The linear portion 22a is positioned along the linear LED array 18, and the connection portions 22b electrically connect the LED nodes 20 to the linear portion 22a.

According to the present invention, the elongated substrate 12 comprises a plurality of partial separation lines 24. The partial separation lines 24 may indicate for a user where the customizable light strip 10/elongated substrate 24 may be partially separated. The partial separation lines 24 may be arranged between at least some of the LED nodes 20. In FIG. 1a a partial separation line 24 is provided between each two adjacent LED nodes 20 of the linear LED array 18. Here, the number of partial separation lines 24 may be the same as the number of LED nodes±1.

In a variant illustrated in FIG. 1a, the LED nodes 20 are grouped into linear LED node groups 26, wherein a partial separation line 24 instead is provided between each two adjacent LED node groups 26 of the linear LED array 18. In this variant, the number of partial separation lines 24 may be the same as the number of LED node groups #1. Also in this variant, the connection portions 22b of the interconnection structure 22 connect the LED node groups 26 to the linear portion 22a. Each linear LED node group 26 may for example comprise 2-80 LED nodes 20.

The partial separation lines 24 extend from the first longitudinal edge 16a of the elongated substrate 12 and partly across the substrate 12 towards the opposite second longitudinal edge 16b, but do not intersect the interconnection structure 22. In other words, there are interconnect-free (partially separable) segments between the LED nodes 20 (or between the linear LED node groups 26 in FIG. 1a'). Preferably the partial separation lines 24 extend perpendicular to the first longitudinal edge 16a and hence parallel to portions 22b of the interconnection structure 22, past the linear LED array 18, but end before the linear portion 22a of the interconnection structure 22.

The partial separation lines 24 may be visual markings indicating for a user where to cut the elongated substrate 12. The visual markings 24 could for example be dotted lines (as in e.g. FIG. 1a) printed on the elongated substrate 12, optionally together with a printed scissor symbol 28. At the ends of the partial separation lines/visual markings 24 opposite the first longitudinal edge 16a, the elongated substrate 12 could be provided with a physical structure 30 adapted to prevent users from cutting too far. The physical structure 30 could for example be an embedded metal wire or a plastic notch. The partial separation lines 24 could alternatively be perforation lines (not shown), for allowing a user to tear the elongated substrate 12.

Figure 5A:
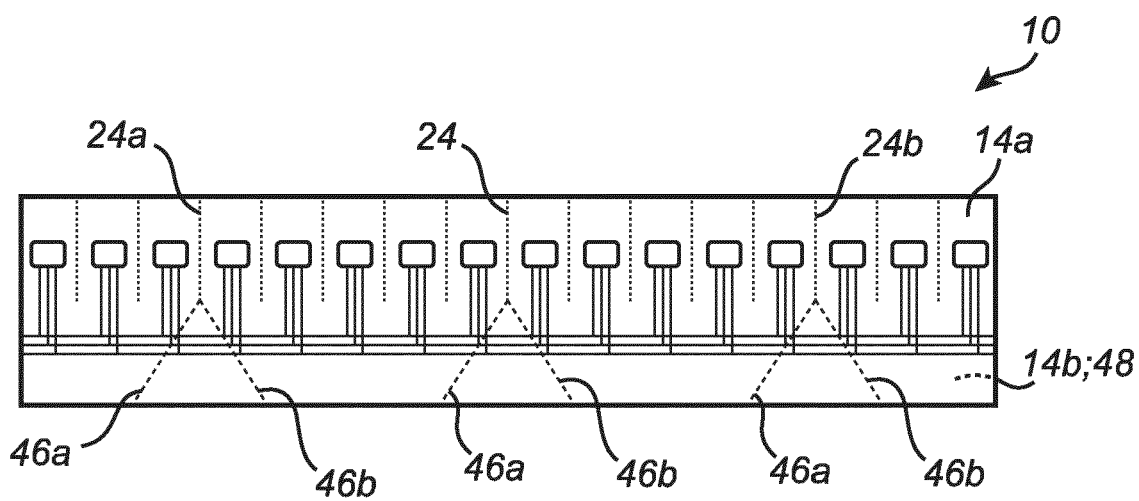
FIG. 5a is a top view of a customizable light strip according to yet another embodiment of the present invention.
Figure 5B:
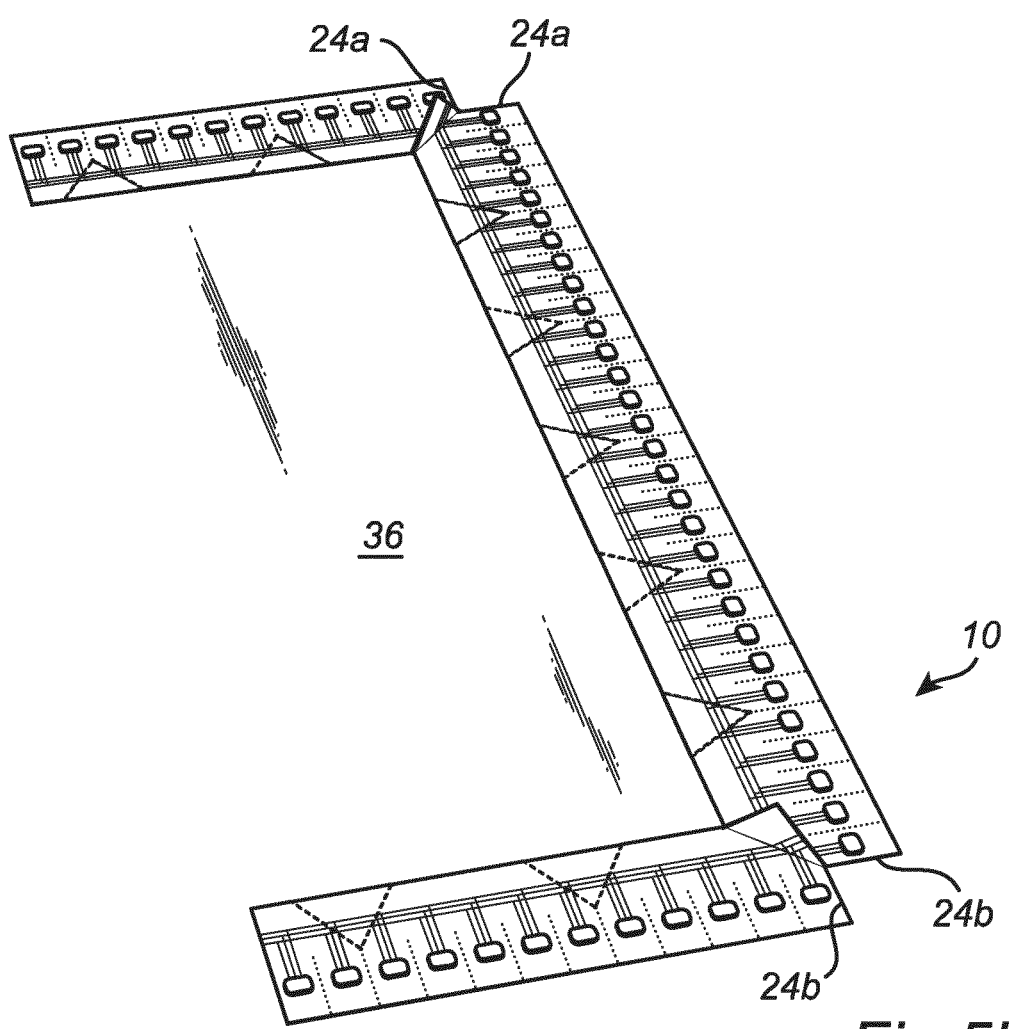
FIG. 5b is a top view of the light strip of FIG. 5a customized and mounted to a mounding surface.

The elongated substrate 12 may further be provided with at least one folding line, such as longitudinal folding lines 32a-c in FIG. 1a (or angular folding lines 46a-b in FIGS. 5a-b). The at least one folding line may for example be at least one longitudinal folding line, extending from a first end of the elongated substrate 12 to the opposite second end of the elongated substrate 12 and in parallel with the longitudinal edges 16a-b, the linear LED array 18, and the linear portion 22a of the interconnection structure 22, like the folding lines 32a-c in FIG. 1a. The folding line(s) may for example be visual marking(s) on the elongated substrate 12 indicating for the user where to fold the substrate/light strip 10. The visual marking(s) could be similar to, but should nevertheless be distinct from, the aforementioned visual markings 24 for cutting the elongated substrate 12. Visual markings like 32-c indicating folding lines may for example be dashed lines, whereas the visual markings 24 are dotted lines.

The elongated substrate 12 may further comprise at least one linear attachment layer, such as linear attachment layers 34a-b in FIG. 1a. The linear attachment layer(s) may extend along (substantially) the complete length L of the elongated substrate 12. The linear attachment layer(s) may for example be at least one adhesive layer or double-sided tape.

In the embodiment of FIG. 1a, a first longitudinal folding line 32a on the elongated substrate 12 is provided between the linear portion 22a of the interconnection structure 22 and the linear LED array 18, wherein the connection portions 22b of the interconnection structure 22 cross the first longitudinal folding line 32a (at right angles). A second longitudinal folding line 32b on the elongated substrate 12 is provided between the linear LED array 18 and the first longitudinal edge 16a of the elongated substrate 12. A third longitudinal folding line 32c on the elongated substrate 12 is provided between the linear portion 22a of the interconnection structure 22 and the opposite second longitudinal edge 16b of the elongated substrate 12. Furthermore, a first linear attachment layer 34a is provided on first surface 14a of the elongated substrate 12, between the second longitudinal folding line 32b and the first longitudinal edge 16a of the elongated substrate 12. And a second linear attachment layer 34b is provided on the opposite second surface 14b of the elongated substrate 12, between the third longitudinal folding line 32b and the opposite second longitudinal edge 16b of the elongated substrate 12. The first and second linear attachment layers 34a-b are here positioned at linear sections other than the section comprising the linear LED array 18.

Figure 6:
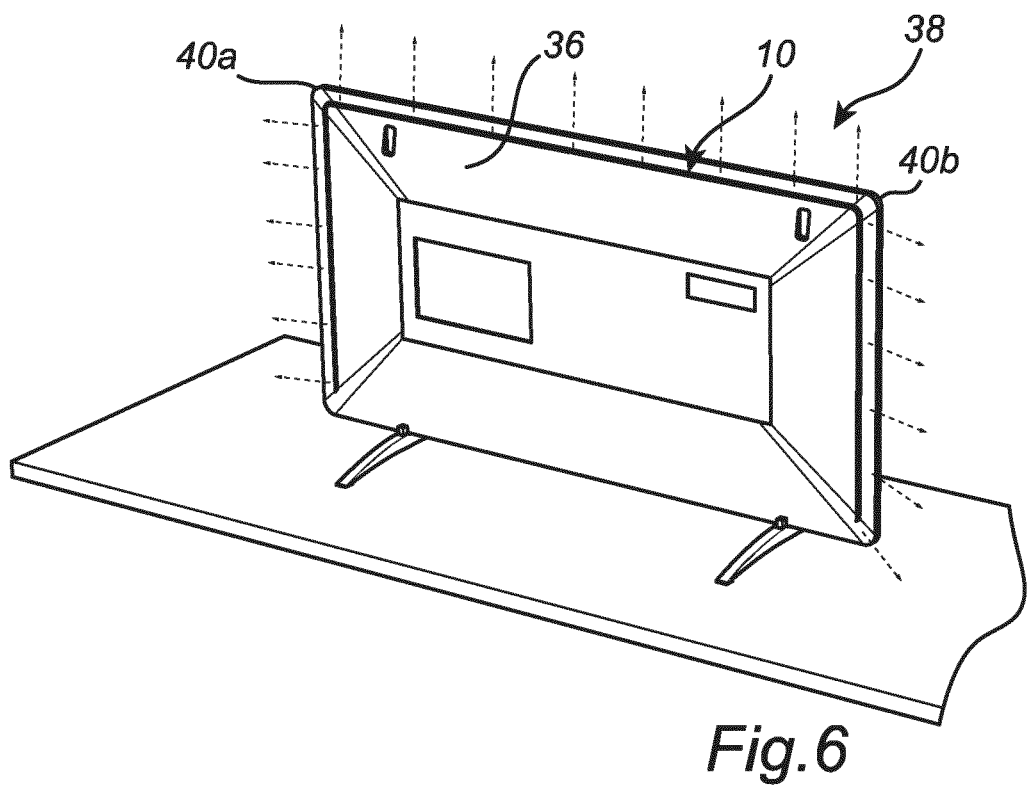
FIG. 6 shows the present light strip mounted on the backside of a TV.

With further reference to FIGS. 1b, 2, 3a, and 6, mounting the customizable light strip 10 to a planar mounting surface 36 may comprise (apart from provision (S1) of the customizable light strip 10) the user partially separating, e.g. cutting, the elongated substrate 12 at one or more of the partial separation lines 24: step S2. For example, if the customizable light strip 10 is to be mounted on the backside of a TV 38, as shown in FIG. 6, the user could partially cut the elongated substrate 12 at a two partial separation line 24' and 24" corresponding to positions just below and inside of the top corners 40a-b of the TV 38. For a 55 inch TV (=121.7 cm×68.6 cm), the first cut partial separation line 24' may be about 60 cm from the first end of the elongated substrate 12, and the second cut partial separation line 24, may likewise be about 60 cm from the opposite second end of the elongated substrate 12. Note that several adjacent partial separation lines 24 could be cut to make a smoother (less sharp) bend of the light strip 10.

After separation, the user may fold (S3) the light strip 10. For example, the light strip in FIG. 1a may be folded at the longitudinal folding lines 32a-c to form a triangular prism-like shape illustrated in FIG. 3a, with the linear LED array 18 on one oblique side 42a of the triangular prism-like shape, the linear interconnection portion 22a on the other oblique side 42b, the section with the first linear attachment layer 34a folded inwards to form the base of the triangular prism-like shape such that the first linear attachment layer 34a may be used to attach to light strip 10 to the mounting surface 36, and the section with the second linear attachment layer 34b folded towards the outside such that the second linear attachment layer 34b too may be used to attach to light strip 10 to the mounting surface 36.

Figure 3A:
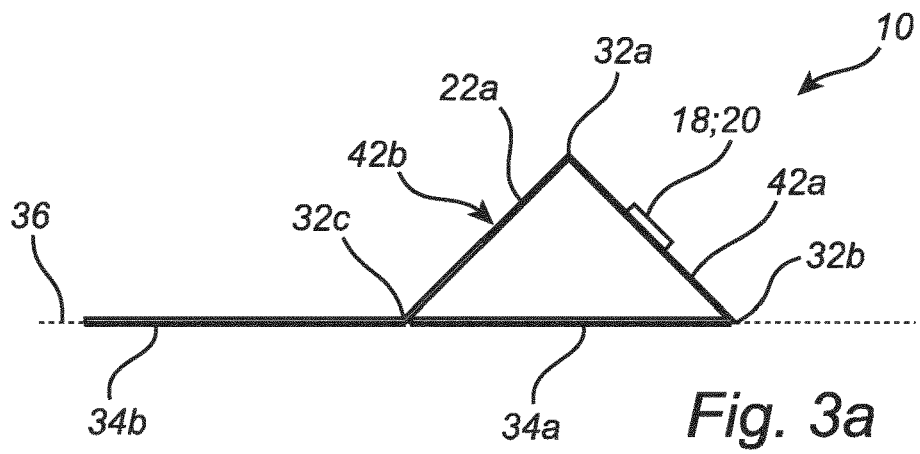
FIGS. 3a-d are cross-sectional views illustrating variants of folding and attaching the light strip of FIG. 1a or FIG. 1a'.
Figure 3B:
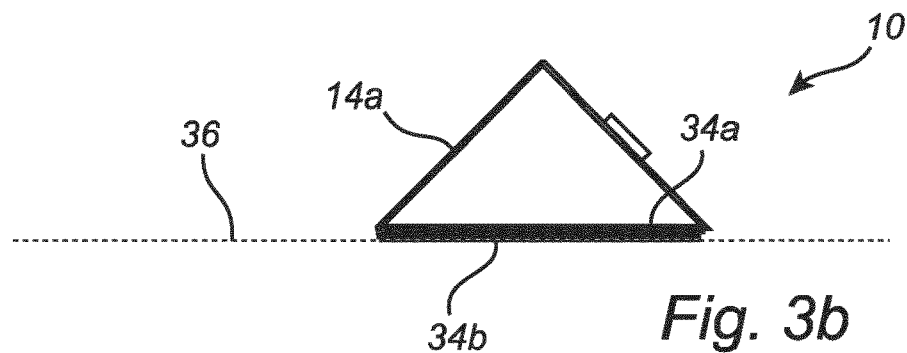
Figure 3C:
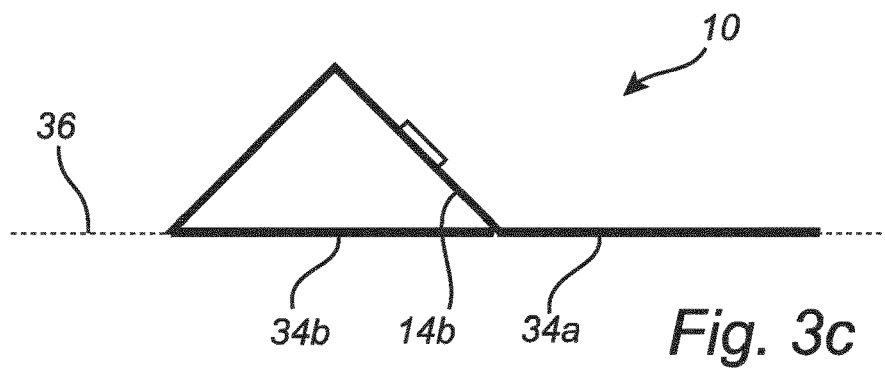
Figure 3D:
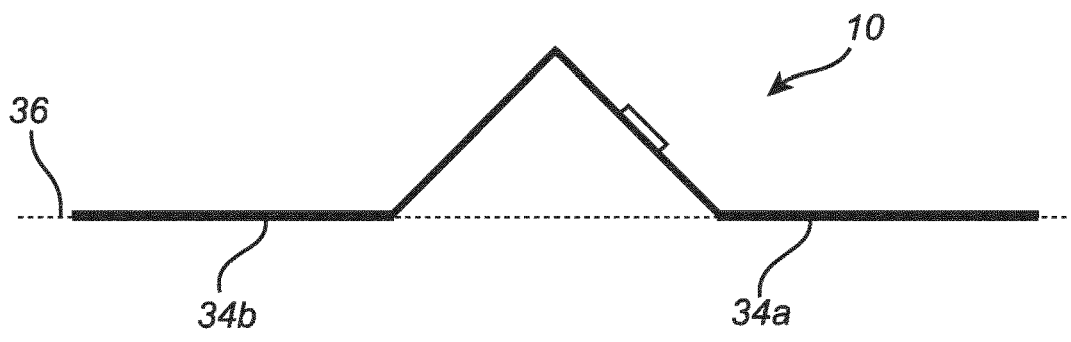

Variants of folding and attaching the light strip 10 are shown in FIGS. 3b-d. FIG. 3b is similar to FIG. 3a, but here the second linear attachment layer 34b is on the first surface 14a of the elongated substrate 12, and the section with the second linear attachment layer 34b is folded inwards, such that the second linear attachment layer 34b may be used to attach to light strip 10 to the mounting surface 36 whereas the first linear attachment layer 34a attaches to the "backside" of the section with the second linear attachment layer 34b (or vice versa). FIG. 3c is similar to FIG. 3b, but here the first linear attachment layer 34a is on the opposite second surface 14b of the elongated substrate 12, and the section with the first linear attachment layer 34a is folded towards the outside such that the first linear attachment layer 34a too may be used to attach to light strip 10 to the mounting surface 36. Finally, FIG. 3d is similar to FIG. 3c, but here the second linear attachment layer 34b is on the second surface 14b of the elongated substrate 12, and the section with the second linear attachment layer 34b is folded towards the outside.

Figure 1B:
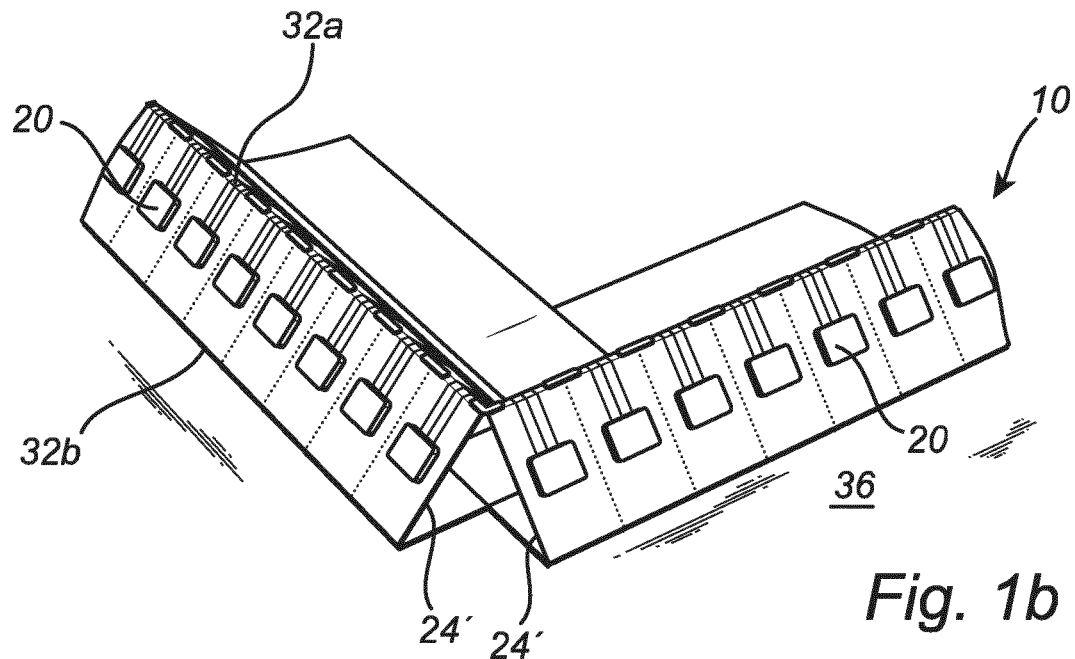
FIG. 1b is a perspective view of the light strip of FIG. 1a customized and mounted to a mounding surface.
Figure 1A:
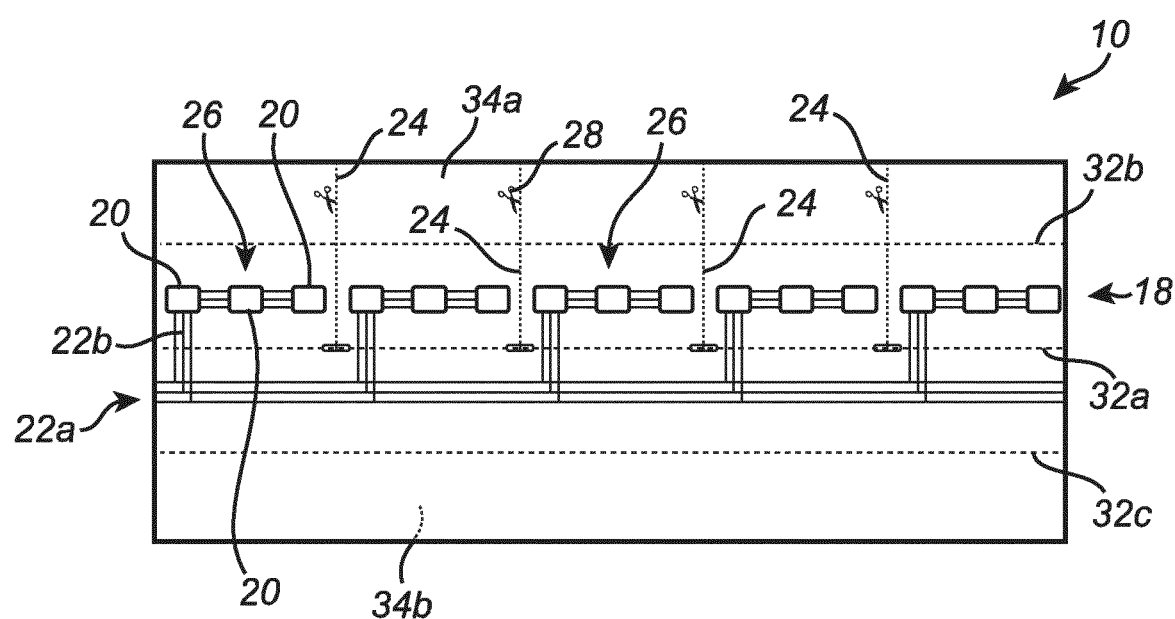
Figure 2:
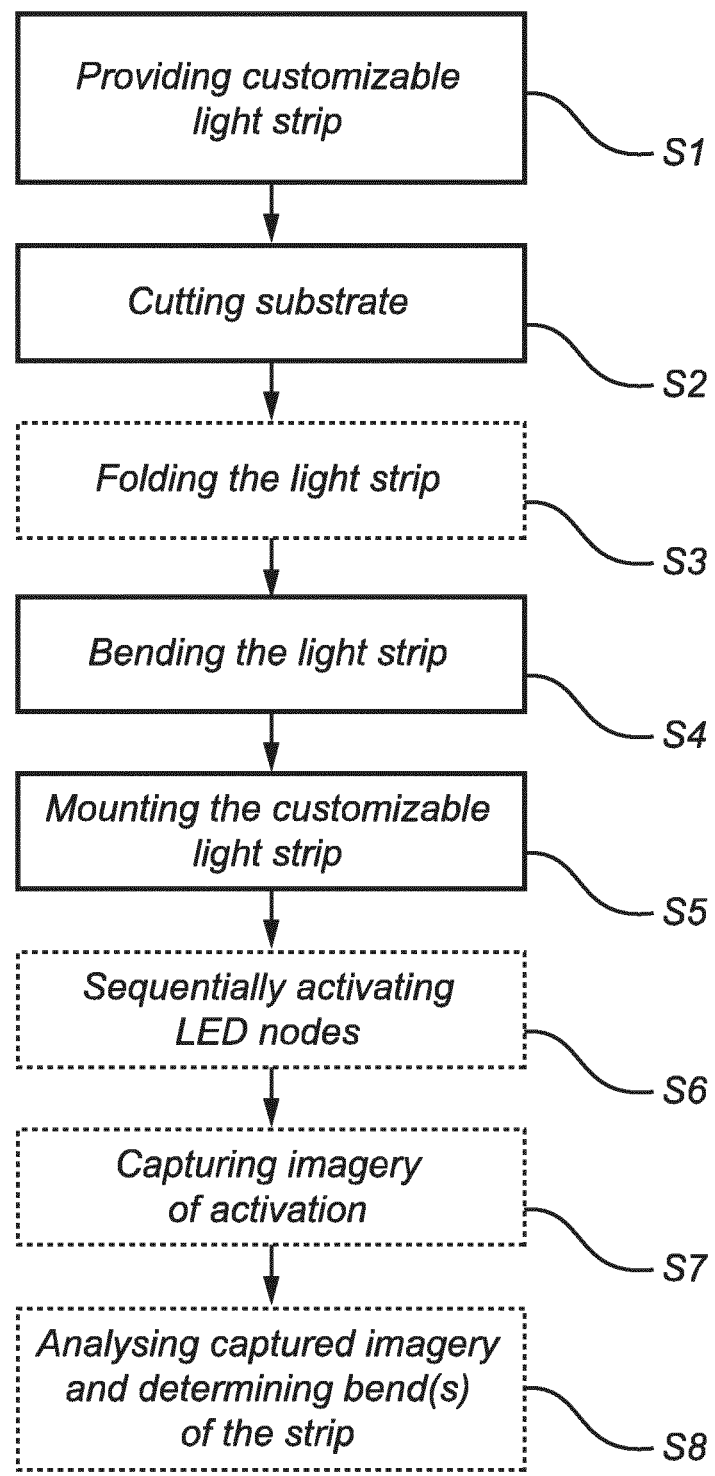
FIG. 2 is a flow chart of a method of mounting a customizable light strip according to an aspect of the present invention.

After folding, the user bends (S4) the light strip 10, in the plane of the mounting surface 36, at the cut partial separation lines such as 24' and 24", see FIG. 1b. In other words, the customizable light strip 10 (after partial separation at one or more of the partial separation lines 24) is capable of being bent in-plane, meaning that the plane(s) in which the light strip 10 resides is/are the same before and after bending.

Then, the user mounts (S5) the bent customized light strip 10 on the mounting surface 36, wherein the bent customized light strip 10 in FIG. 1b is attached to the mounting surface 36 by means of the first and second linear attachment layers 34a-b.

Accordingly, the linear LED array 18 is enabled to follow the corners 40a-b of the TV 38 while being attached to the planar backside 36. An additional advantage is that the folding enables tuning the direction (angle) of the plane with the LED nodes 20 relative to the backside 36 of the TV 36, allowing to properly direct the linear LED array 18 towards a user-preferred position on a wall (not shown) behind the TV 36.

The method could further comprise sequentially activating (S6) the LED nodes 20 of the linear LED array 18: capturing (S7) imagery of the activation by a remote camera (not shown); and analyzing (S8) the captured imagery to determine at least one bend (e.g. at 24' and 24") of the customized light strip 10.

By determining the bends, individual LED nodes 20 can be controlled accordingly, for example if the customized light strip 10 is used to create background light dynamically matching content displayed on the TV 38. The remote camera may for example be the camera of a smart phone or tablet or similar. Analyzing the captured imagery to determine at least one bend of the customizable light strip 10 may for example be performed by an app on the smart phone or tablet.

In other embodiments, the customizable light strip 10 may further comprise at least one data or detection line intersecting the partial separation lines 24. That is, the at least one data or detection line may be interrupted when at least one of the partial separation lines 22 is cut/torn. In this way, the cut/tear position(s) may be detected, which in turn means that individual LED nodes 20 can be controlled accordingly, for example if the customized light strip 10 is used to create background light dynamically matching content displayed on the TV 38.

Figure 7A:
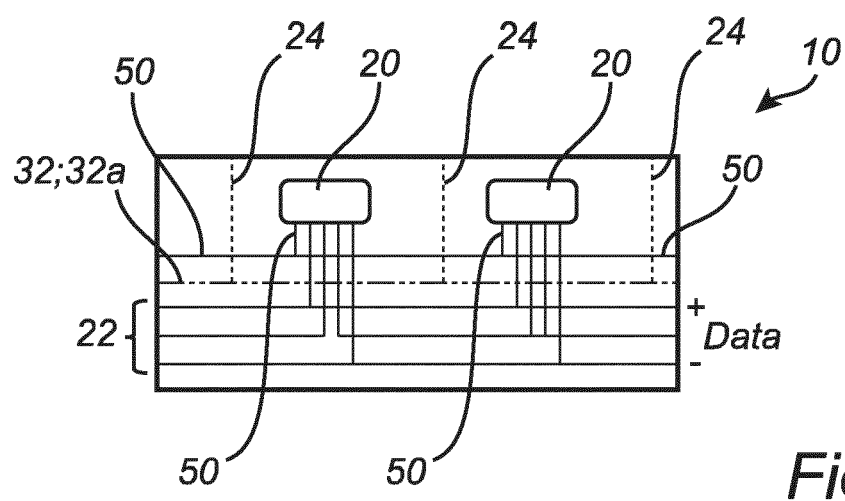
FIGS. 7a-d are partial views of embodiments of the customizable light strip comprising at least one data or detection line.

The at least one data or detection line may for example be a (n additional) data bus 50 connected to the LED nodes 20 and intersecting the partial separation lines 24, see FIG. 7a. LED nodes 20 at either side of the cut/torn data bus 50 may be configured to detect and report via the (non-cut/non-torn) interconnection structure 22 where the cut/tear is.

Figure 7B:
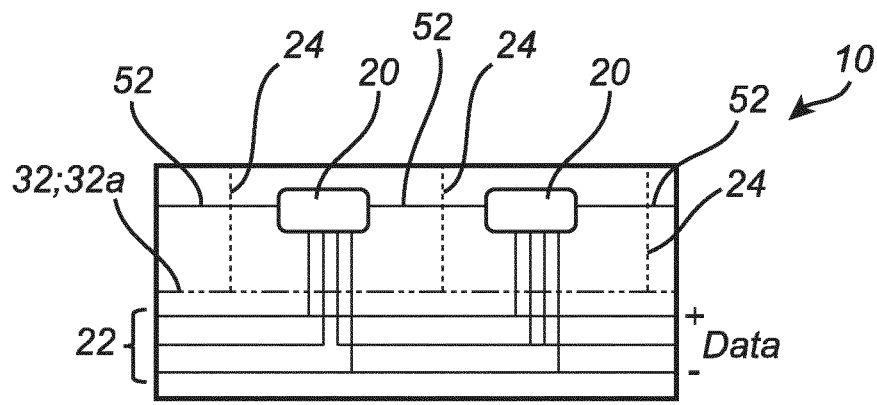

In another example shown in FIG. 7b, the at least one data or detection line may be a data line 52 from LED node 20 to LED node 20 (daisy chain). When a user cuts/tears a partial separation line 24, the LED nodes 20 can detect that they are no longer connected via the data line 52.

Figure 7C:
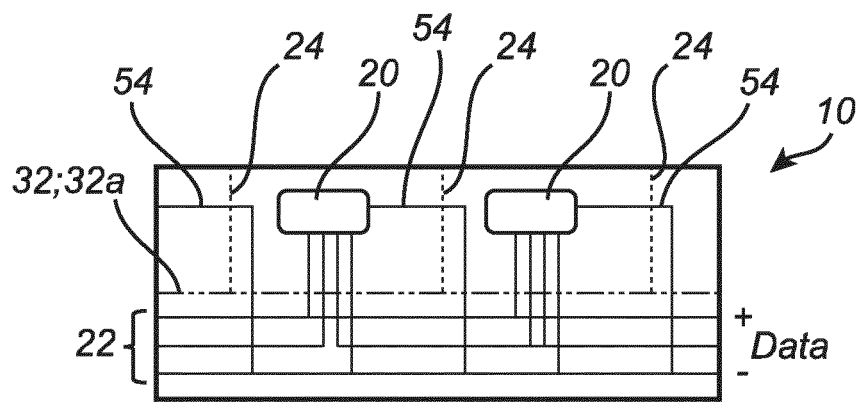

In yet another example shown in FIG. 7c, each LED node 20 has a detection line 54 which intersects a partial separation line 24 and electrically connects the LED node 20) to the interconnections structure 22. When the user cuts/tears the partial separation line 24, the detection line 54 becomes open and the LED node 20 can thereby detect that the user has cut/torn the partial separation line 24.

Figure 7D:
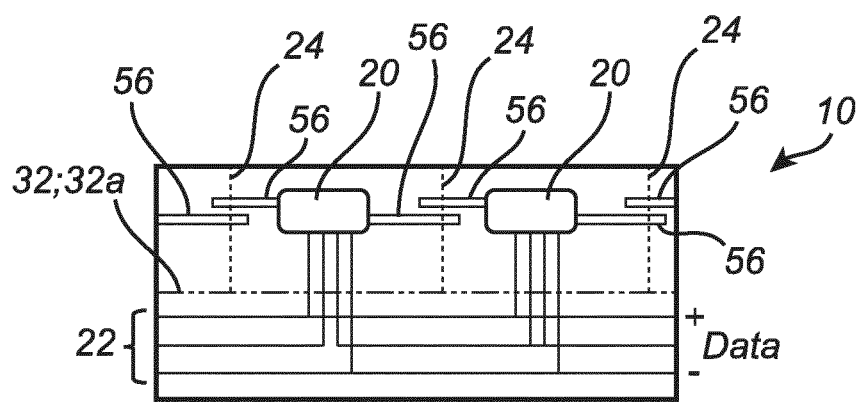

In a further example shown in FIG. 7d, each LED node 20 has on one or both sides a detection line 56. Each detection line 56 extends from the LED node 20, intersects a partial separation line 24, and goes back to the same LED node 20, whereby the LED node 20 may detect whether or not the partial separation line 24 is cut/torn or not.

Figure 4A:
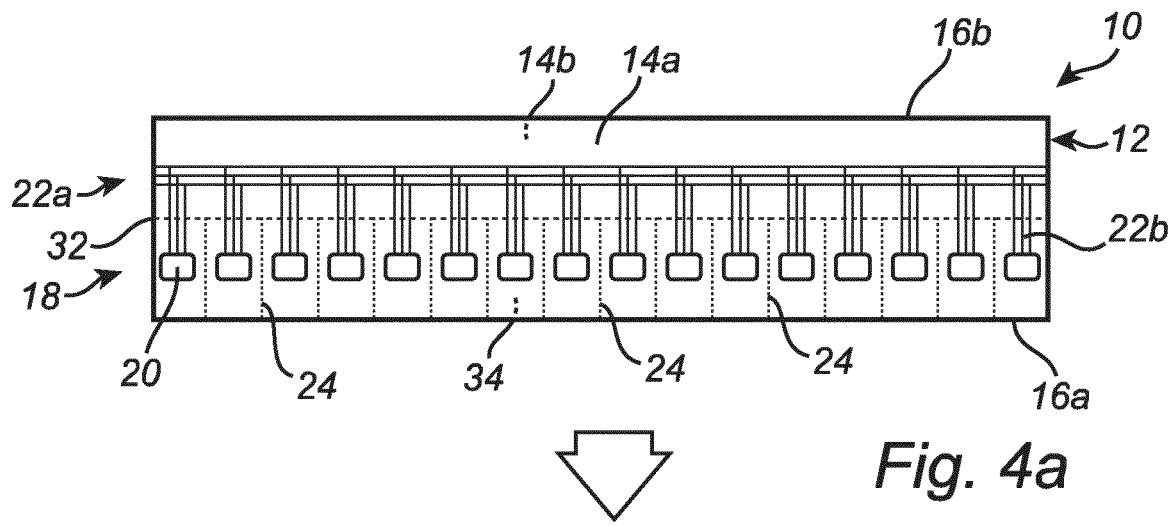
FIG. 4a is a top view of a customizable light strip according to another embodiment of the present invention.
Figure 4B:
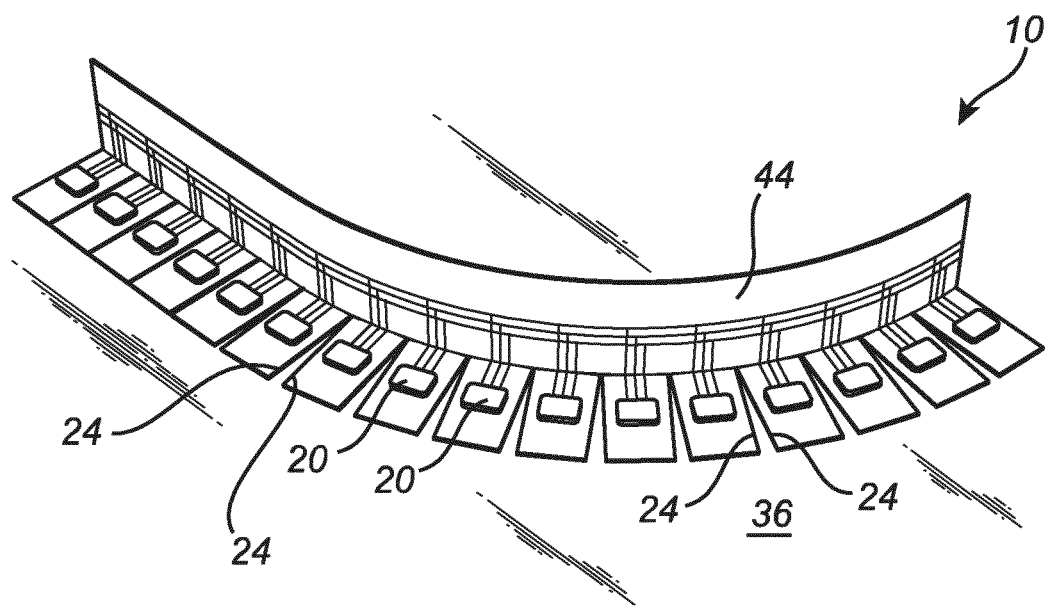
FIG. 4b is a perspective view of the light strip of FIG. 4a customized and mounted to a mounding surface.

In another embodiment of the customizable light strip 10 shown in FIGS. 4a-b, the elongated substrate 12 comprises a single longitudinal folding line 32. The longitudinal folding line 32 is situated between the linear portion 22a of the interconnection structure 22 and the linear LED array 18. Furthermore, a linear attachment layer 34 is provided under the linear LED array 18 on the opposite second surface 14b of the elongated substrate 12. The user here folds (S3) the light strip 10 at the longitudinal folding line 32, to form a linear upright section 44 of the elongated substrate 12. The linear upright section 44 may be perpendicular to the remaining substrate 12 and extends between the longitudinal folding line 32 and the second longitudinal edge 16b of the elongated substrate 12. When the bent customizable light strip is mounted (S5) on a mounting surface 36 and attached to it by means of the linear attachment layer 34, the linear upright section 44 becomes perpendicular to the mounting surface. Depending on the application, the upright section 44 may be diffuse reflective to direct light emitted by LED nodes 20 and/or create a sharp cut-off, or it may be translucent (e.g. diffuse to give a diffuse light effect on the side opposite to the LED nodes 20).

In yet another embodiment shown in FIGS. 5a-b, the elongated substrate 12 has angular folding lines 46a-b on its first surface 14a. The angular folding lines 46a-b extend from some predetermined partial separation lines 24. Here, a pair of angular folding lines 46a-b extends from each of the predetermined partial separation lines 24 at ±135° relative to the partial separation line 24. This allows the light strip 10 to be bent 90° in step S4, see FIG. 5b. The predetermined partial separation lines 24 may correspond to typical cut/tear positions, for example based on common TV sizes. For a 55 inch TV (=121.7 cm×68.6 cm), a first predetermined partial separation line 24a from which angular folding lines 46a-b extend may be about 60 cm from the first end of the elongated substrate 12, and a second predetermined partial separation line 24b from which angular folding lines 46a-b extend may likewise be about 60 cm from the opposite second end of the elongated substrate 12. Furthermore, a linear attachment layer 48 is provided on the opposite second surface 14b of the elongated substrate 12. The linear attachment layer 48 may here cover the entire second surface 14b.

The person skilled in the art realizes that the present invention by no means is limited to the preferred embodiments described above. On the contrary, many modifications and variations are possible within the scope of the appended claims. For example, instead of being mounted to the backside of a TV 38, the present light strip 10 could alternatively be mounted/attached to the backside of a monitor, to the back of a mirror, bed headboard, cupboard, bottom of couch, around or inside a cabinet, etc.

Additionally, variations to the disclosed embodiments can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

The invention claimed is:

1. A customizable light strip mountable on a mounting surface, comprising:
    an elongated substrate;
    a linear LED array with a plurality of LED nodes mounted on a surface of the elongated substrate; and
    an interconnection structure electrically interconnecting the plurality of LED nodes,
    wherein the elongated substrate comprises partial separation lines between at least some of the plurality of LED nodes of the linear LED array, which partial separation lines extend from one longitudinal edge of the elongated substrate and partly across the elongated substrate and do not intersect the interconnection structure,
    wherein the customizable light strip after partial separation at one or more of the partial separation lines is bendable in a plane of said mounting surface,
    wherein the customizable light strip further comprises a data or detection line connected to at least some of the LED nodes and intersecting the partial separation lines, and
    wherein the LED nodes are configured to detect the position of any partially separated partial separation line through interruption of the data or detection line intersecting that partial separation line.

2. A customizable light strip (10) according to claim 1, wherein the partial separation lines include visual markings for cutting the elongated substrate.

3. A customizable light strip according to claim 1, wherein the partial separation lines include perforation lines for allowing a user to tear the elongated substrate.

4. A customizable light strip according to claim 1, wherein a partial separation line of said partial separation lines is provided between each two adjacent LED nodes of the linear LED array.

5. A customizable light strip according to claim 1, wherein the plurality of LED nodes is grouped into linear LED node groups, and wherein a partial separation line of said partial separation lines is provided between each two adjacent LED node groups of the linear LED array.

6. A customizable light strip according to claim 1, wherein the interconnection structure comprises a linear portion and connection portions, wherein the linear portion is positioned along the linear LED array, and wherein the connection portions electrically connect at least some of the LED nodes of the linear LED array to the linear portion of the interconnection structure.

7. A customizable light strip according to claim 6, wherein at least one longitudinal folding line on the elongated substrate is provided between the linear portion of the interconnection structure and the linear LED array, and wherein the connection portions of the interconnection structure cross the at least one longitudinal folding line.

8. A customizable light strip according to claim 7, wherein:
    A second longitudinal folding line on the elongated substrate is provided between the linear LED array and said longitudinal edge of the elongated substrate;
    at least one linear attachment layer includes a first linear attachment layer provided on said surface or the opposite surface of the elongated substrate between said second longitudinal folding line and said longitudinal edge of the elongated substrate;
    a third longitudinal folding line on the elongated substrate is provided between the linear portion of the interconnection structure and an opposite longitudinal edge of the elongated substrate; and
    the at least one linear attachment layer includes a second linear attachment layer provided on said surface or the opposite surface of the elongated substrate between said third longitudinal folding line and said opposite longitudinal edge of the elongated substrate.

9. A customizable light strip according to claim 7, wherein:
    the elongated substrate comprises a single longitudinal folding line between the linear portion of the interconnection structure and the linear LED array;
    at least one linear attachment layer includes a linear attachment layer under the linear LED array on the opposite surface of the elongated substrate; and
    a linear substantially upright section of the elongated substrate extending between said single longitudinal folding line and the opposite longitudinal edge of the elongated substrate is diffuse reflective or translucent for manipulating light emitted by LED nodes of the linear LED array.

10. A customizable light strip according to claim 1, wherein the elongated substrate) comprises at least one linear attachment layer.

11. A customizable light strip according to claim 10, wherein angular folding lines on the elongated substrate extend from at least some predetermined partial separation lines of said partial separation lines, and wherein the at least one linear attachment layer includes a linear attachment layer on the opposite surface of the elongated substrate.

12. A method of mounting a customizable light strip to a planar mounting surface, which method comprises:
    providing a customizable light strip according to claim 1;
    partially separating the elongated substrate of the customizable light strip at one or more of the partial separation lines;
    after separation, bending the customizable light strip at said one or more partial separation lines; and
    mounting the bent customizable light strip on said planar mounting surface.

13. A method according to claim 12, wherein the planar mounting surface is the backside of an electronic display device, including a TV or a monitor.

14. A method according to claim 12, further comprising:
    after bending, sequentially activating the LED nodes of the linear LED array;
    capturing imagery of the activation by a remote camera; and analyzing the captured imagery to determine at least one bend of the customizable light strip.

* * * * *